United States Patent
Lear et al.

(10) Patent No.: US 10,686,485 B1
(45) Date of Patent: Jun. 16, 2020

(54) HIGH ISOLATION DUPLEXER/QUASI CIRCULATOR WITH TWO QUADRATURE COUPLERS

(71) Applicant: Qorvo US, Inc., Greensboro, NC (US)

(72) Inventors: Kelly M. Lear, Longwood, FL (US); Jeffrey D. Galipeau, Apopka, FL (US)

(73) Assignee: Qorvo US, Inc., Greensboro, NC (US)

(*) Notice: Subject to any disclaimer, the term of this patent is extended or adjusted under 35 U.S.C. 154(b) by 0 days.

(21) Appl. No.: 16/380,302

(22) Filed: Apr. 10, 2019

Related U.S. Application Data

(60) Provisional application No. 62/776,138, filed on Dec. 6, 2018.

(51) Int. Cl.
| | |
|---|---|
| *H04B 1/44* | (2006.01) |
| *H03H 7/46* | (2006.01) |
| *H04L 5/14* | (2006.01) |
| *H01P 1/18* | (2006.01) |
| *H04B 1/04* | (2006.01) |
| *H04B 1/525* | (2015.01) |

(52) U.S. Cl.
CPC .......... *H04B 1/44* (2013.01); *H01P 1/18* (2013.01); *H03H 7/463* (2013.01); *H04B 1/0458* (2013.01); *H04B 1/525* (2013.01); *H04L 5/1461* (2013.01); *H04L 5/1469* (2013.01)

(58) Field of Classification Search
CPC ........ H04B 1/44; H04B 1/525; H04B 1/0458; H04L 5/1469; H04L 5/1461; H03H 7/463; H01P 1/18
See application file for complete search history.

(56) References Cited

U.S. PATENT DOCUMENTS

| | | | | |
|---|---|---|---|---|
| 9,154,179 | B2* | 10/2015 | Gudem | H04B 1/109 |
| 9,172,402 | B2* | 10/2015 | Gudem | H04B 1/0057 |
| 9,240,622 | B2 | 1/2016 | Schmidhammer et al. | |
| 9,413,414 | B2* | 8/2016 | Knox | H04L 12/40013 |
| 9,490,866 | B2* | 11/2016 | Goel | H04B 1/525 |
| 9,590,794 | B2* | 3/2017 | Analui | H04L 5/1461 |
| 9,843,302 | B2 | 12/2017 | Analui et al. | |
| 9,871,543 | B2 | 1/2018 | Analui et al. | |
| 10,038,458 | B2 | 7/2018 | Mandegaran | |

(Continued)

OTHER PUBLICATIONS

Cheung, S., et al., "Active Quasi-Circulators using Quadrature Hybrids for Simultaneous Transmit and Receive," International Microwave Symposium Digest, Jun. 2009, IEEE, pp. 381-384.

*Primary Examiner* — Lewis G West
(74) *Attorney, Agent, or Firm* — Withrow & Terranova, P.L.L.C.

(57) ABSTRACT

A high isolation duplexer/quasi circulator with two quadrature couplers is disclosed. Isolation between a transmit (TX) port and receive (RX) port of the quasi circulator is improved through use of two quadrature couplers. The quadrature couplers are coupled such that a first TX-RX signal path (from the TX port to the RX port) is shifted at or near 180 degrees from a second TX-RX signal path. These paths cancel each other to provide a high level of isolation between the TX port and the RX port. There are two signal paths between an antenna (ANT) port and the quadrature couplers for both TX signals and RX signals. A phase shift circuit is coupled to the ANT port of one or both duplexers such that the signals passing through the quadrature couplers to the ANT port are combined substantially in phase.

20 Claims, 6 Drawing Sheets

(56) References Cited

U.S. PATENT DOCUMENTS

| | | | |
|---|---|---|---|
| 10,270,149 B2* | 4/2019 | Hou | H01P 1/38 |
| 2004/0127178 A1* | 7/2004 | Kuffner | H01P 1/15 |
| | | | 455/133 |
| 2006/0087376 A1* | 4/2006 | Young | H03F 1/523 |
| | | | 330/286 |
| 2010/0148886 A1 | 6/2010 | Inoue et al. | |
| 2010/0289598 A1* | 11/2010 | Cheung | H01P 1/213 |
| | | | 333/109 |
| 2013/0083703 A1* | 4/2013 | Granger-Jones | H04B 1/525 |
| | | | 370/277 |
| 2013/0234806 A1* | 9/2013 | Schmidhammer | H01P 1/213 |
| | | | 333/133 |
| 2014/0269864 A1* | 9/2014 | Aparin | H04B 1/40 |
| | | | 375/221 |
| 2015/0236842 A1 | 8/2015 | Goel et al. | |
| 2016/0112072 A1* | 4/2016 | Bauder | H04B 1/0057 |
| | | | 370/297 |
| 2018/0083591 A1 | 3/2018 | Mandegaran | |
| 2018/0309464 A1 | 10/2018 | Mandegaran | |
| 2019/0319681 A1* | 10/2019 | Natarajan | H04L 5/1461 |
| 2019/0326944 A1* | 10/2019 | Khlat | H04B 1/0057 |

* cited by examiner

HIGH ISOLATION DUPLEXER/QUASI CIRCULATOR WITH TWO QUADRATURE COUPLERS

RELATED APPLICATIONS

This application claims the benefit of provisional patent application Ser. No. 62/776,138, filed Dec. 6, 2018, the disclosure of which is hereby incorporated herein by reference in its entirety.

FIELD OF THE DISCLOSURE

The present disclosure relates to radio frequency duplexers.

BACKGROUND

In radio frequency (RF) transceiver systems, a duplexer or circulator is frequently used to enable simultaneous signal transmission and reception over a single antenna. A magnetic circulator routes the signals between a transmit (TX) port, an antenna port (ANT), and a receive (RX) port while providing isolation between the TX port and the RX port. The magnetic circulator includes a permanent magnet which causes signals to pass through its material along one direction, such that signals travel from the TX port to the ANT port and from the ANT port to the RX port. These magnetic circulators can be excessively large.

A traditional duplexer similarly includes an ANT port, a TX port, and an RX port, and facilitates simultaneous signal transmission and reception. With the traditional duplexer, the TX signals and RX signals are generally at different RF carrier frequencies, and the duplexer provides isolation between the TX port and RX port by filtering the signals which pass through the duplexer. The isolation between TX and RX paths of a traditional duplexer is often less than system requirements when the TX and RX carrier signals are closely spaced in the frequency domain.

SUMMARY

This application relates to a high isolation duplexer/quasi circulator with two quadrature couplers. Isolation between a transmit (TX) port and receive (RX) port of the quasi circulator is improved through use of two quadrature couplers. The quadrature couplers are coupled such that a first TX-RX signal path (from the TX port to the RX port) is shifted at or near 180 degrees from a second TX-RX signal path. These paths cancel each other to provide a high level of isolation between the TX port and the RX port. There are two signal paths between an antenna (ANT) port and the quadrature couplers for both TX signals and RX signals. A phase shift circuit is coupled to the ANT port of one or both duplexers such that the signals passing through the quadrature couplers to the ANT port are combined substantially in phase.

An exemplary aspect relates to a radio frequency (RF) circuit. The RF circuit includes an ANT port configured to couple to an RF antenna, a TX port configured to couple to TX circuitry, and an RX port configured to couple to RX circuitry. The RF circuit also includes a TX quadrature coupler having an input coupled to the TX port and an RX quadrature coupler having an input coupled to the RX port. The RF circuit also includes a first duplexer coupled to the ANT port without an intervening quadrature coupler, the TX quadrature coupler, and the RX quadrature coupler. The RF circuit also includes a second duplexer coupled to the ANT port, the TX quadrature coupler, and the RX quadrature coupler.

Another exemplary aspect relates to a quasi circulator. The quasi circulator includes an ANT port, a TX port, and an RX port. A first TX-RX path through the quasi circulator comprises the TX port, a TX quadrature coupler, a first duplexer, an RX quadrature coupler, and the RX port. A second TX-RX path through the quasi circulator comprises the TX port, the TX quadrature coupler, a second duplexer, the RX quadrature coupler, and the RX port. A first TX-ANT path through the quasi circulator comprises the TX port, the TX quadrature coupler, the first duplexer, a first phase shift circuit, and the ANT port. A first ANT-RX path through the quasi circulator comprises the ANT port, the second duplexer, the RX quadrature coupler, and the RX port.

Another exemplary aspect relates to an RF circuit. The RF circuit includes an ANT port, a TX port, and an RX port. The RF circuit also includes a first duplexer coupled to the ANT port and a second duplexer directly coupled to the ANT port. The RF circuit also includes a TX quadrature coupler having an input coupled to the TX port, a first output coupled to the first duplexer, and a second output coupled to the second duplexer. The RF circuit also includes an RX quadrature coupler having an input coupled to the RX port, a first output coupled to the first duplexer, and a second output coupled to the second duplexer.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

Figure 1:
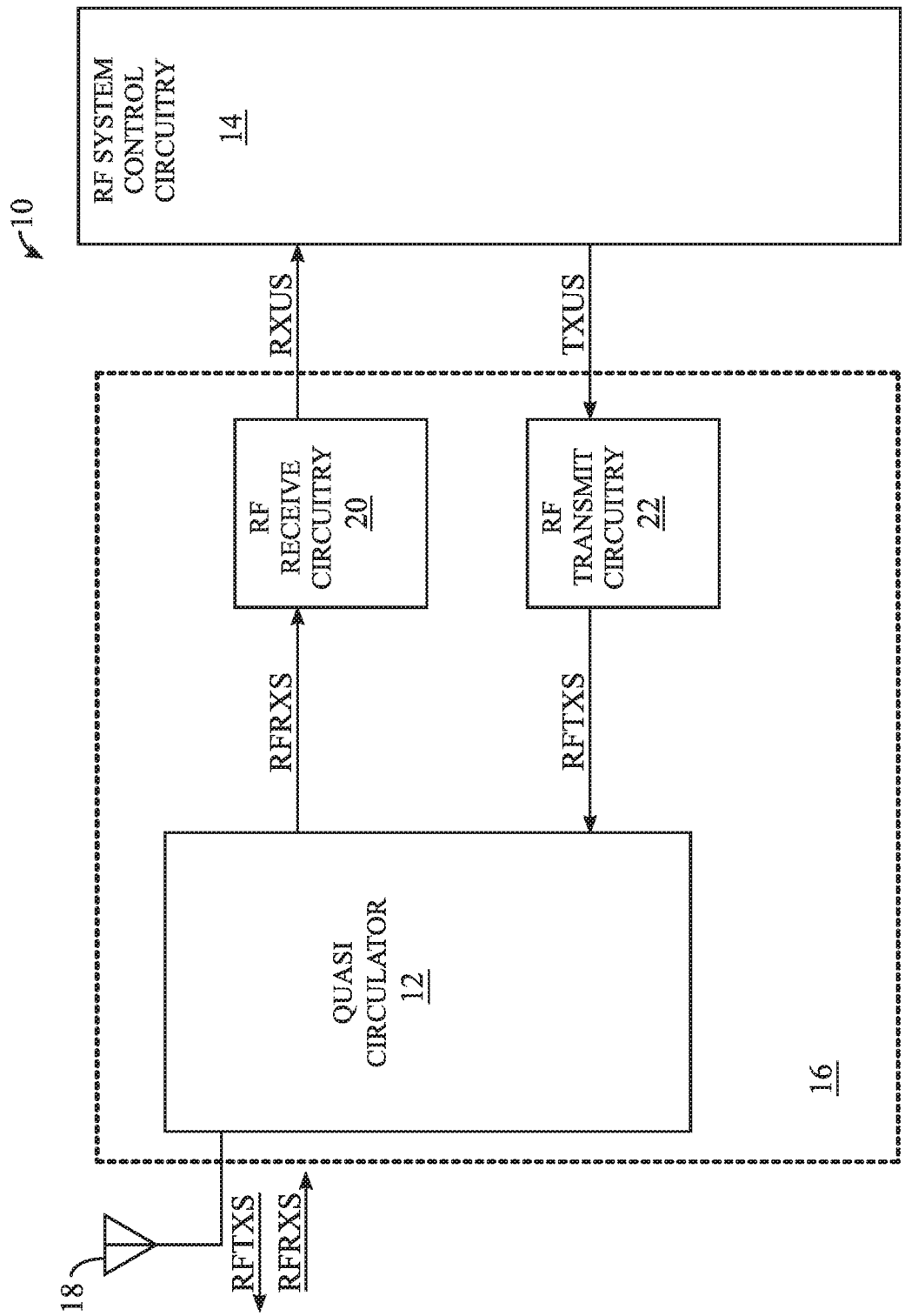
FIG. 1 is a schematic diagram of radio frequency (RF) communications circuitry which includes a quasi circulator.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

This application relates to a high isolation duplexer/quasi circulator with two quadrature couplers. Isolation between a transmit (TX) port and receive (RX) port of the quasi circulator is improved through use of two quadrature couplers. The quadrature couplers are coupled such that a first TX-RX signal path (from the TX port to the RX port) is shifted at or near 180 degrees from a second TX-RX signal path. These paths cancel each other to provide a high level of isolation between the TX port and the RX port. There are two signal paths between an antenna (ANT) port and the quadrature couplers for both TX signals and RX signals. A phase shift circuit is coupled to the ANT port of one or both duplexers such that the signals passing through the quadrature couplers to the ANT port are combined substantially in phase.

FIG. 1 is a schematic diagram of a radio frequency (RF) communications circuit 10 which includes a quasi circulator 12. The RF communications circuit 10 includes RF system control circuitry 14, RF front-end circuitry 16, and an RF antenna 18. The RF front-end circuitry 16 includes the quasi circulator 12, RF RX circuitry 20, and RF TX circuitry 22. The quasi circulator 12 facilitates simultaneous signal transmission and reception over the RF antenna 18. In this regard, the quasi circulator 12 facilitates sending an RF TX signal RFTXS from the RF TX circuitry 22 to the RF antenna 18 while sending an RF RX signal RFRXS from the RF antenna 18 to the RF RX circuitry 20. The quasi circulator 12 also provides isolation between the RF RX circuitry 20 and RF TX circuitry 22.

In an exemplary aspect, the RF system control circuitry 14 provides an upstream TX signal TXUS to the RF TX circuitry 22. The RF TX circuitry 22 processes the upstream TX signal TXUS to provide the RF TX signal RFTXS to the quasi circulator 12. The RF TX circuitry 22 may include up-conversion circuitry, amplification circuitry, power supply circuitry, filtering circuitry, switching circuitry, combining circuitry, splitting circuitry, dividing circuitry, clocking circuitry, the like, or any combination thereof to process the upstream TX signal TXUS. The quasi circulator 12, in turn, forwards the RF TX signal RFTXS to the RF antenna 18 to be transmitted wirelessly.

The quasi circulator 12 also forwards the RF RX signal RFRXS received wirelessly by the RF antenna 18 to the RF RX circuitry 20. The RF RX circuitry 20 receives and processes the RF RX signal RFRXS to provide an upstream RX signal RXUS. The RF RX circuitry 20 may include down-conversion circuitry, amplification circuitry, low noise amplification circuitry, power supply circuitry, filtering circuitry, switching circuitry, combining circuitry, splitting circuitry, dividing circuitry, clocking circuitry, the like, or any combination thereof. It should be understood that the RF TX circuitry 22 and the RF RX circuitry 20 are illustrated between the quasi circulator 12 and the RF system control circuitry 14 for illustrative purposes. In other examples, at least some of the RF TX circuitry 22 and/or the RF RX circuitry 20 may be positioned between the quasi circulator 12 and the RF antenna 18.

The quasi circulator 12 provides a high level of isolation between the RF RX circuitry 20 and the RF TX circuitry 22. This may be of particular benefit to the RF RX circuitry 20. For example, the RF TX signal RFTXS may be much higher power than the RF RX signal RFRXS, and the quasi circulator 12 may prevent damage to sensitive components in the RF RX circuitry 20 from the RF TX signal RFTXS. In addition, amplifiers in the RF RX circuitry 20 may be prevented from amplifying portions of the RF TX signal RFTXS, which may drown out or otherwise interfere with processing of the RF RX signal RFRXS.

Figure 2A:
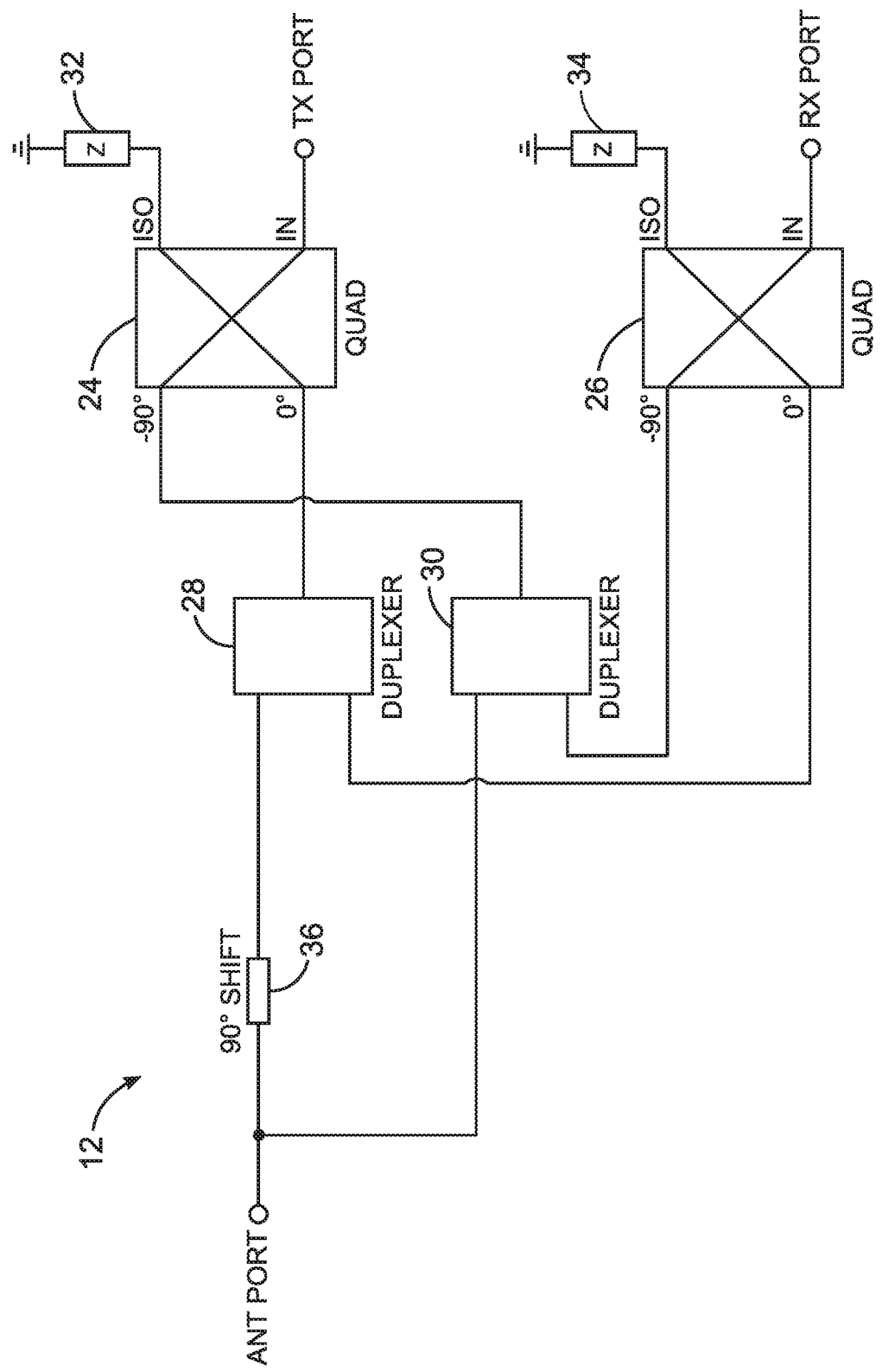
FIG. 2A is a schematic diagram of an exemplary quasi circulator, including two traditional duplexers.

FIG. 2A is a schematic diagram of an exemplary quasi circulator 12. The quasi circulator 12 includes an ANT port, which can couple to the RF antenna 18 in FIG. 1 to facilitate simultaneous transmission and reception of RF signals. The quasi circulator 12 also includes a TX port, which can couple to the RF TX circuitry 22, and an RX port, which can couple to the RF RX circuitry 20.

In an exemplary aspect, the quasi circulator 12 includes a TX quadrature coupler 24, an RX quadrature coupler 26, a first duplexer 28, and a second duplexer 30. Each of the TX quadrature coupler 24 and the RX quadrature coupler 26 can be a hybrid coupler or another appropriate quadrature coupler. For example, the TX quadrature coupler 24 includes an input IN, a first isolation port ISO, a first output 0°, and a second output −90°. With a first impedance network 32 coupled to the first isolation port ISO, the TX quadrature coupler 24 couples a TX signal received at the input IN into the first output 0° and the second output −90° (which is phase shifted from the first output 0° by minus 90 degrees). The RX quadrature coupler 26 functions in a corresponding manner, with a second impedance network 34 coupled to a second isolation port ISO.

Each of the first duplexer 28 and the second duplexer 30 can be a traditional RF duplexer. In this regard, the first duplexer 28 and the second duplexer 30 can each include filters (e.g., bandpass filters, notch filters, combinations of high-pass filters and low-pass filters, and so on) to separate TX signals and RX signals and facilitate use of the common ANT port. The first duplexer 28 and the second duplexer 30 can include acoustic resonators, such as surface acoustic wave (SAW) resonators, bulk acoustic wave (BAW) resonators, and/or combinations of SAW resonators and BAW resonators. In some examples, the first duplexer 28 and the second duplexer 30 are matched to one another.

The input IN of the TX quadrature coupler 24 is coupled to the TX port. The first output 0° of the TX quadrature coupler 24 is coupled to the first duplexer 28, and the second output −90° is coupled to the second duplexer 30. The input IN of the RX quadrature coupler 26 is coupled to the RX port. The first output 0° of the RX quadrature coupler 26 is coupled to the first duplexer 28, and the second output −90° is coupled to the second duplexer 30.

The first duplexer 28 provides a first path between the ANT port and the first output 0° of the TX quadrature coupler 24 (e.g., a first TX-ANT path), as well as between the ANT port and the first output 0° of the RX quadrature coupler 26 (e.g., a first ANT-RX path). The second duplexer 30 provides a second path between the ANT port and the second output 90° of the TX quadrature coupler 24 (e.g., a second TX-ANT path), as well as between the ANT port and the second output −90° of the RX quadrature coupler 26 (e.g., a second ANT-RX path).

The TX quadrature coupler 24 and the RX quadrature coupler 26 provide isolation between the TX port and the RX port, as described further below with respect to FIG. 3. Such isolation is not needed between the TX port and the ANT port, or between the RX port and the ANT port. Accordingly, the first duplexer 28 and the second duplexer 30 are each coupled to the ANT port without an intervening quadrature coupler. In some examples, a phase shift circuit 36 is coupled to the ANT port to reduce or eliminate the phase shift between the first TX-ANT path/first ANT-RX path through the first duplexer 28 and the second TX-ANT path/second ANT-RX path through the second duplexer 30 caused by the TX quadrature coupler 24 and RX quadrature coupler 26. The phase shift circuit 36 can be a 90 degree phase shift line between the ANT port and the first duplexer 28, which can reduce the phase shift to less than five degrees across a band of interest (e.g., a TX passband and/or an RX passband). In this example, the second duplexer 30 can be directly coupled to the ANT port. The phase shift circuit 36 can also be implemented in other manners, such as being split between the signal paths to the ANT port, as described below with respect to FIG. 3 and FIG. 4.

Figure 2B:
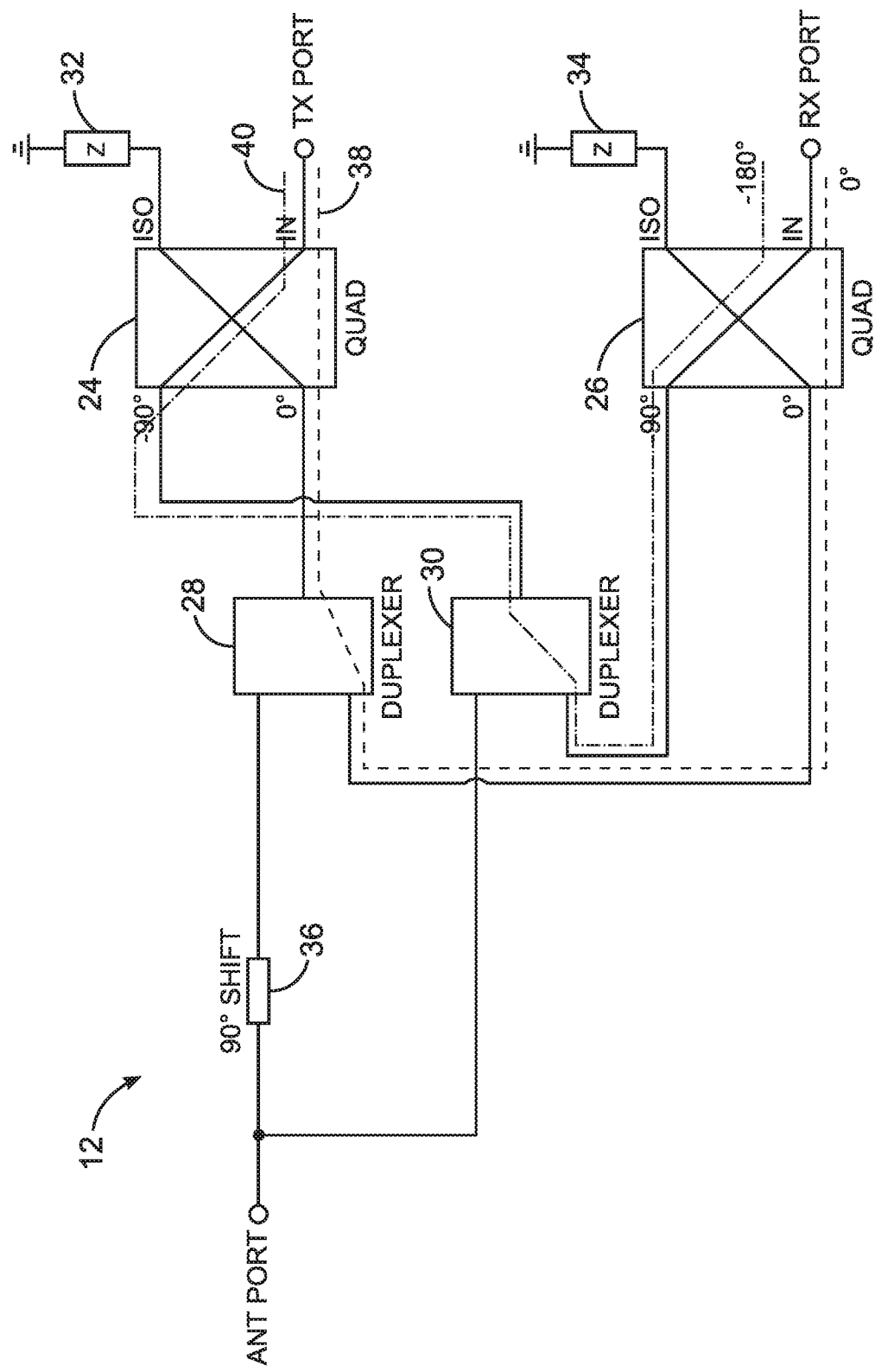
FIG. 2B is a schematic diagram of the exemplary quasi circulator of FIG. 2A, illustrating signal paths through the quasi circulator.

FIG. 2B is a schematic diagram of the exemplary quasi circulator 12 of FIG. 2A, illustrating signal paths through the quasi circulator 12. A first TX-RX path 38 through the quasi circulator 12 passes between the TX port and the RX port through the TX quadrature coupler 24, the first duplexer 28, and the RX quadrature coupler 26. A second TX-RX path 40 passes between the TX port and the RX port through the TX quadrature coupler 24, the second duplexer 30, and the RX quadrature coupler 26.

In this regard, TX signals arriving at the RX quadrature coupler 26 destructively interfere with one another. The TX quadrature coupler 24 couples a TX signal received at the input IN into the first output 0° and the second output −90° at approximately half signal power. A first TX signal follows the first TX-RX path 38, and a second TX signal follows the second TX-RX path 40. As the second TX signal passes through the TX quadrature coupler 24, it is phase shifted by minus 90 degrees relative to the first TX signal, and is phase shifted by an additional minus 90 degrees relative to the first TX signal. Thus, the first TX signal through the first TX-RX path 38 and the second TX signal through the second TX-RX path 40 are phase shifted by 180 degrees to mostly or entirely cancel one another. This provides isolation between the TX port and the RX port.

In contrast, TX signals arriving at the ANT port constructively interfere with one another. A first TX-ANT path passes between the TX port and the ANT port through the first duplexer 28 and the phase shift circuit 36. A second TX-ANT path passes between the TX port and the ANT port through the second duplexer 30. As the second TX signal through the second TX-ANT path passes through the TX quadrature coupler 24, it is phase shifted by minus 90 degrees relative to the first TX signal. As the first TX signal through the first TX-ANT path passes through the phase shift circuit 36, it is phase shifted by a corresponding 90 degrees such that the first TX signal and the second TX signal have a relative phase shift of less than one degree.

Figure 3:
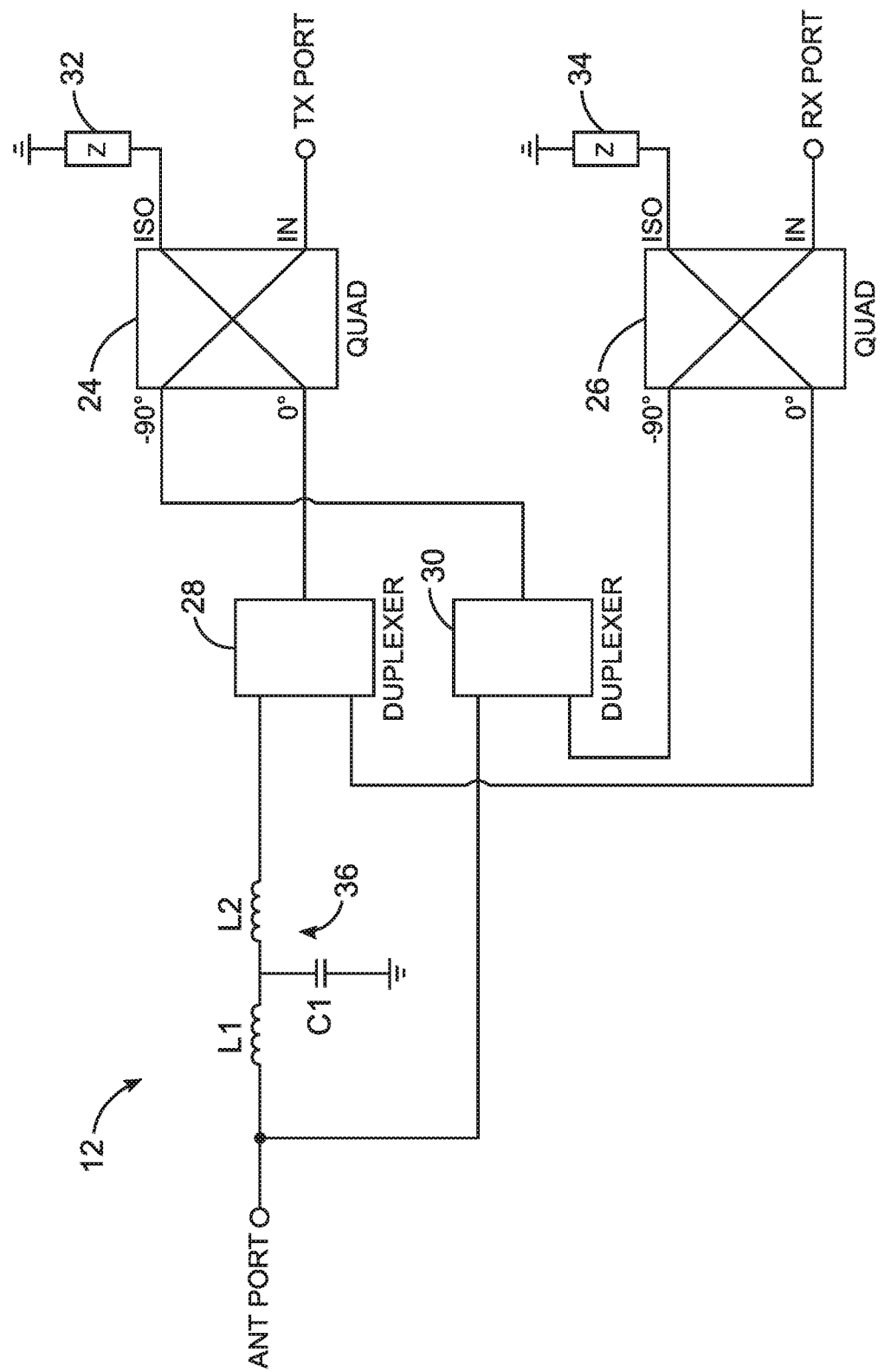
FIG. 3 is a schematic diagram of another exemplary quasi circulator.

FIG. 3 is a schematic diagram of another exemplary quasi circulator 12. In this example, the phase shift circuit 36 includes an inductor-capacitor network to provide the 90 degree phase shift between the ANT port and the first duplexer 28. The phase shift circuit 36 includes a first inductor L1 and a second inductor L2 in series between the ANT port and the first duplexer 28. The phase shift circuit 36 also includes a capacitor C1 coupled in shunt to a node between the first inductor L1 and the second inductor L2 and a ground. In this or other examples, the phase shift circuit 36 can include an inductor-capacitor-transmission line network to provide the 90 degree phase shift between the ANT port and the first duplexer 28.

Figure 4:
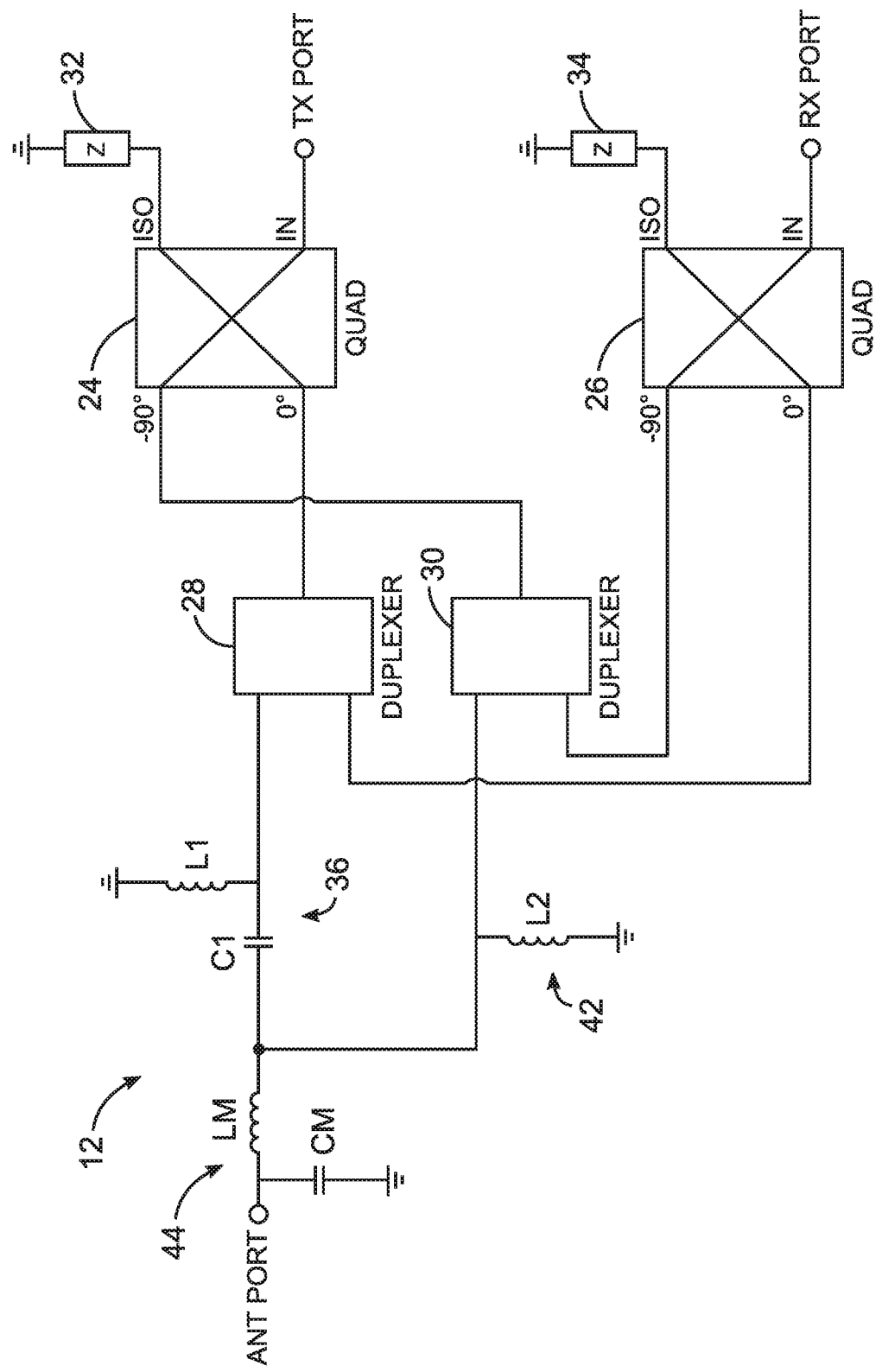
FIG. 4 is a schematic diagram of another exemplary quasi circulator, with a phase shift circuit split between signal paths to the antenna (ANT) port.

FIG. 4 is a schematic diagram of another exemplary quasi circulator 12. In this example, the quasi circulator 12 includes a first phase shift circuit 36 between the ANT port and the first duplexer 28 and a second phase shift circuit 42 between the ANT port and the second duplexer 30. The first phase shift circuit 36 and the second phase shift circuit 42 together reduce or eliminate the phase shift between the first TX-ANT path/first ANT-RX path through the first duplexer 28 and the second TX-ANT path/second ANT-RX path through the second duplexer 30 caused by the TX quadrature coupler 24 and RX quadrature coupler 26.

For example, the first phase shift circuit 36 can provide a minus 45 degrees phase shift while the second phase shift circuit 42 provides a plus 45 degrees phase shift (or another split which results in a difference of approximately 90 degrees). The first phase shift circuit 36 includes a first capacitor C1 coupled between the ANT port and the first duplexer 28, and a first inductor L1 coupled in shunt to a node between the first capacitor C1 and the first duplexer 28. The second phase shift circuit 42 includes a second inductor L2 coupled in shunt between the ANT port and the second duplexer 30.

In some examples, impedance matching for the quasi circulator 12 can be provided through an impedance matching circuit 44. The impedance matching circuit 44 can be coupled to the ANT port, and can include a matching capacitor CM coupled in shunt and a matching inductor LM coupled in series with the ANT port. It should be understood that the impedance matching circuit 44 can also be implemented in the quasi circulator 12 of FIG. 2A or FIG. 3, and can be coupled differently (e.g., at the TX port and RX port).

Figure 5:
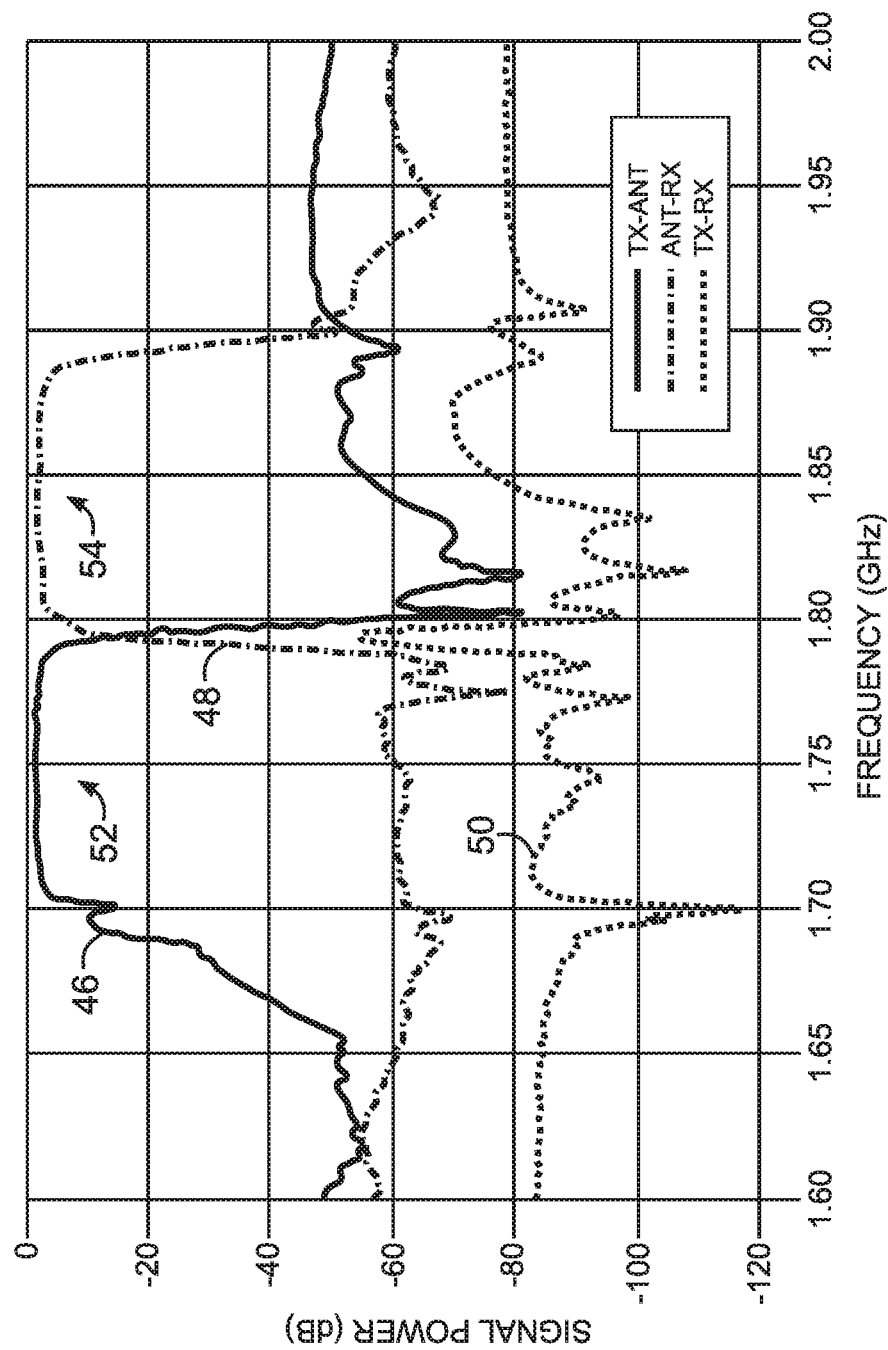
FIG. 5 is a graphical representation of performance of the exemplary quasi circulator and traditional duplexers of FIG. 4.

FIG. 5 is a graphical representation of performance of the exemplary quasi circulator 12 of FIG. 4. The graph of FIG. 5 shows the signal power in decibels (dB) as a function of frequency for signals passing between the TX port and ANT port (TX-ANT performance 46), signals passing between the ANT port and RX port (ANT-RX performance 48), and signals passing between the TX port and RX port (TX-RX performance 50).

In this regard, the first TX-ANT path and the second TX-ANT path through the exemplary quasi circulator 12 of FIG. 4 provide bandpass filtering with a TX passband 52 about 1.75 gigahertz (GHz) (e.g., between 1.71 GHz and 1.78 GHz), as shown in the TX-ANT performance 46. Similarly, the first ANT-RX path and the second ANT-RX path provide bandpass filtering with an RX passband 54 about 1.85 GHz (e.g., between 1.80 GHz and 1.87 GHz), as shown in the ANT-RX performance 48.

In addition, the quasi circulator 12 provides isolation between the TX port and the RX port, as shown in the TX-RX performance 50. Greater isolation is achieved in the quasi circulator 12 over traditional duplexer designs, with greater than 80 decibels (dB) of isolation below 1.77 GHz and greater than 50 dB of isolation through all frequencies of interest. Thus, the quasi circulator 12 improves isolation over traditional duplexers by 15 to 25 dB through the frequencies of interest. For example, the quasi circulator 12 provides (through the first TX-RX path and the second TX-RX path) greater than 80 dB of isolation between the TX port and the RX port within the TX passband 52.

Those skilled in the art will recognize improvements and modifications to the preferred embodiments of the present disclosure. All such improvements and modifications are considered within the scope of the concepts disclosed herein and the claims that follow.

What is claimed is:

1. A radio frequency (RF) circuit, comprising:
an antenna (ANT) port configured to couple to an RF antenna;
a transmit (TX) port configured to couple to TX circuitry;
a receive (RX) port configured to couple to RX circuitry;
a TX quadrature coupler having an input coupled to the TX port;
an RX quadrature coupler having an input coupled to the RX port;
a first duplexer coupled to the ANT port without an intervening quadrature coupler, the TX quadrature coupler, and the RX quadrature coupler; and
a second duplexer coupled to the ANT port, the TX quadrature coupler, and the RX quadrature coupler.

2. The RF circuit of claim 1, wherein the second duplexer is coupled to the ANT port without an intervening quadrature coupler.

3. The RF circuit of claim 1, further comprising a phase shift circuit coupled to the ANT port.

4. The RF circuit of claim 3, wherein the phase shift circuit comprises a 90 degree phase shift line between the ANT port and the first duplexer.

5. The RF circuit of claim 3, wherein the phase shift circuit comprises an inductor-capacitor network between the ANT port and the first duplexer.

6. The RF circuit of claim 5, wherein:
the inductor-capacitor network is an inductor-capacitor-transmission line network; and
the inductor-capacitor-transmission line network is further between the ANT port and the second duplexer.

7. The RF circuit of claim 1, wherein the second duplexer is directly coupled to the ANT port.

8. The RF circuit of claim 1, wherein the RF circuit provides greater than 50 dB isolation between the TX port and the RX port.

9. The RF circuit of claim 1, further comprising:
a first impedance network coupled to a first isolation port of the TX quadrature coupler; and
a second impedance network coupled to a second isolation port of the RX quadrature coupler.

10. A quasi circulator, comprising:
an antenna (ANT) port;
a transmit (TX) port; and
a receive (RX) port;
wherein:
a first TX-RX path through the quasi circulator comprises the TX port, a TX quadrature coupler, a first duplexer, an RX quadrature coupler, and the RX port;
a second TX-RX path through the quasi circulator comprises the TX port, the TX quadrature coupler, a second duplexer, the RX quadrature coupler, and the RX port;
a first TX-ANT path through the quasi circulator comprises the TX port, the TX quadrature coupler, the first duplexer, a first phase shift circuit, and the ANT port;
a first ANT-RX path through the quasi circulator comprises the ANT port, the second duplexer, the RX quadrature coupler, and the RX port.

11. The quasi circulator of claim 10, wherein the first ANT-RX path does not include any additional quadrature coupler.

12. The quasi circulator of claim 10, wherein a second TX-ANT path through the quasi circulator comprises the TX port, the TX quadrature coupler, the second duplexer, and the ANT port.

13. The quasi circulator of claim 12, wherein less than one degree of phase shift occurs at the ANT port between a first TX signal through the first TX-ANT path and a second TX signal through the second TX-ANT path.

14. The quasi circulator of claim 12, wherein the second TX-ANT path further comprises a second phase shift circuit.

15. The quasi circulator of claim 10, wherein the first TX-ANT path provides bandpass filtering at a TX passband.

16. The quasi circulator of claim 15, wherein the first TX-RX path and the second TX-RX path provide greater than 80 dB of isolation between the TX port and the RX port within the TX passband.

17. A radio frequency (RF) circuit, comprising:
an antenna (ANT) port;
a transmit (TX) port;
a receive (RX) port;
a first duplexer coupled to the ANT port;
a second duplexer directly coupled to the ANT port;
a TX quadrature coupler having an input coupled to the TX port, a first output coupled to the first duplexer, and a second output coupled to the second duplexer; and
an RX quadrature coupler having an input coupled to the RX port, a first output coupled to the first duplexer, and a second output coupled to the second duplexer.

18. The RF circuit of claim 17, wherein:
TX signals arriving at the RX quadrature coupler destructively interfere with one another; and
TX signals arriving at the ANT port constructively interfere with one another.

19. The RF circuit of claim 17, further comprising a first phase shift circuit coupled to the ANT port such that a first TX signal through the first duplexer and a second TX signal through the second duplexer have a relative phase shift of less than five degrees across a band of interest.

20. The RF circuit of claim 19, further comprising a second phase shift circuit coupled between the ANT port and the second duplexer;
    wherein the first phase shift circuit is coupled between the ANT port and the first duplexer.

\* \* \* \* \*